(12) United States Patent
Ikarashi et al.

(10) Patent No.: US 6,326,092 B1
(45) Date of Patent: Dec. 4, 2001

(54) MAGNETORESISTANCE DEVICE AND PRODUCTION METHOD THEREOF

(75) Inventors: Kazuaki Ikarashi, Miyagi-ken; Naoya Hasegawa; Akihiro Makino, both of Niigata-ken, all of (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/593,120

(22) Filed: Jun. 13, 2000

Related U.S. Application Data

(63) Continuation of application No. 08/928,765, filed on Sep. 12, 1997, now Pat. No. 6,210,810.

(30) Foreign Application Priority Data

Sep. 19, 1996 (JP) .................................................. 8-248382

(51) Int. Cl.[7] ...................................................... G11B 5/66
(52) U.S. Cl. ................. 428/692; 428/654 R; 428/654 T; 428/654 TS; 428/634 TM; 428/900; 360/113; 360/125; 360/126; 338/32 R; 324/252
(58) Field of Search ..................... 428/694 R, 694 T, 428/694 TS, 694 TM, 692, 900; 360/113, 125, 126; 338/32 R; 324/252

(56) References Cited

U.S. PATENT DOCUMENTS

| 5,159,513 | 10/1992 | Dieny et al. ........................ 360/113 |
|---|---|---|
| 5,373,238 | 12/1994 | McGuire et al. ..................... 324/252 |
| 5,688,380 | 11/1997 | Koike et al. ....................... 204/192.2 |
| 5,698,335 | 12/1997 | Iwasaki et al. ...................... 438/611 |
| 5,742,458 | 4/1998 | Koike et al. ......................... 360/113 |
| 5,923,504 | 7/1999 | Araki et al. ......................... 360/113 |
| 6,210,810 | * 4/2001 | Ikarashi et al. ..................... 428/611 |

FOREIGN PATENT DOCUMENTS 0 794 581 A1    9/1997  (EP) .

* cited by examiner

*Primary Examiner*—Leszek Kiliman
(74) *Attorney, Agent, or Firm*—Brinks Hofer Gilson & Lione

(57) ABSTRACT

A magnetoresistance device comprising at least two ferromagnetic layers separated by a non-magnetic layer, the coercive force of one of the ferromagnetic layers being enhanced by a coercive force enhancement layer of an antiferromagnetic material disposed adjacent to the one of the ferromagnetic layer thereby pinning magnetization inversion in the one of the ferromagnetic layer, the other ferromagnetic layer serving as a free ferromagnetic layer in which magnetization inversion is allowed, wherein the spin orientation in the coercive force enhancement layer is aligned in a multilayer fashion into a direction substantially parallel to the plane of the coercive force enhancement layer. A method of producing such a device is also disclosed.

6 Claims, 11 Drawing Sheets

MAGNETORESISTANCE DEVICE AND PRODUCTION METHOD THEREOF

This application is a continuation of U.S. Ser. No. 08/928,765 entitled "MAGNETORESISTANCE DEVICE AND PRODUCTION METHOD THEREOF", filed Sep. 12, 1997, now U.S. Pat No. 6,210,810.

BACKGROUND OF THE INVENTION

1. Field of the Related Art

The present invention relates to a magnetoresistance device for use in a magnetic head, a position sensor, rotation sensor or the like, and also to a method of producing such a magnetoresistance device. The present invention also relates to a magnetic head provided with such a magnetoresistance device.

2. Description of the Related Art

Magnetoresistance reading heads (MR heads) are known in the art. They include an AMR (anisotropic magnetoresistance) head utilizing the anisotropic magnetoresistance effect, and a GMR (giant magnetoresistance) head utilizing spin-dependent scattering of conduction electrons. An example of a GMR head is a spin-valve head disclosed in U.S. Pat. No. 5,159,513. This spin-valve head shows a high magnetoresistance effect in response to a low external magnetic field.

FIGS. 17 and 18 are simplified schematic diagrams illustrating the structure of an AMR head.

In the AMR head shown in FIG. 17, an electrically insulating layer 2 and a ferromagnetic layer (AMR material layer) 3 are successively formed on a soft magnetic layer 1, and antiferromagnetic layers 4 are formed on either end of the ferromagnetic layer 3 in such a manner that the antiferromagnetic layers 4 are spaced by an amount corresponding to the track width. Furthermore, an electrically conductive layer 5 is formed on each antiferromagnetic layer 4. On the other hand, the AMR head shown in FIG. 18 comprises: a multilayer structure including a soft magnetic layer 1, an electrically insulating layer 1, and a ferromagnetic layer 3; magnet layers 6 formed at either side of the multilayer structure in such a manner that the multilayer structure is located between the two magnet layers 6; and an electrically conductive layer 5 formed on each magnet layer 6.

To operate AMR heads of the types described above under optimum conditions, it is required to apply two magnetic bias fields to the ferromagnetic layer 3 having the AMR property.

A first magnetic bias field serves to make the ferromagnetic layer 3 change linearly in resistance in response to a magnetic flux from a magnetic medium. The first magnetic bias field is applied in a direction at a right angle with respect to the surface of the magnetic medium (in the Z direction in FIG. 17) and parallel to the film plane of the ferromagnetic layer 3. The first bias magnetic field is generally called a transverse bias field, and is produced by passing a detection current from the electrically conductive layer 5 into the AMR head.

The second magnetic bias field is generally called a longitudinal bias field, and is applied in a direction parallel to both the film plane of the magnetic medium and the ferromagnetic layer 3 (in the X direction in FIG. 17). The longitudinal bias field serves to suppress Barkhausen noise due to formation of a large number of magnetic domains in the ferromagnetic layer 3, thereby obtaining a smooth and low-noise resistance change in response to the magnetic flux from the magnetic medium.

To suppress the Barkhausen noise, it is required to make the ferromagnetic layer 3 into the form of a single domain. To this end, there are two known methods of applying a longitudinal bias field. In a first method, the magnetic head structure shown in FIG. 18 is employed, and leakage of magnetic flux from the magnet layers 6 disposed at either side of the ferromagnetic layer 3 is used. In the second method, the magnetic head structure shown in FIG. 17 is employed, and an exchange anisotropic magnetic field produced at the interfacial boundary between the antiferromagnetic layer 4 and the ferromagnetic layer 3 is used.

A specific example of a magnetoresistance device utilizing the exchange anisotropic coupling of the antiferromagnetic layer is the exchange bias type device shown in FIG. 19. Another example is shown in FIG. 20, which is knows as the spin-valve type device.

The magnetic head shown in FIG. 19 has a structure similar to that shown in FIG. 17, and comprises a lower insulating layer 21, a ferromagnetic layer 22, a non-magnetic layer 23, and a ferromagnetic layer 24 having the magnetoresistance property wherein these layers are formed into a multilayer structure. Furthermore, antiferromagnetic layers 25 and a lead layer 26 are formed in such a manner that they are spaced by an amount corresponding to the track width TW.

In the structure shown in FIG. 19, as a result of the exchange anisotropic coupling at the interfacial boundary between the ferromagnetic layer 24 and the antiferromagnetic layer 25, a longitudinal bias field is applied to the ferromagnetic layer 24 thereby converting a region B shown in FIG. 19 (where the ferromagnetic layer 24 and the antiferromagnetic layer 25 are in contact with each other) into a single domain directed in the X direction. This induces the ferromagnetic layer 24 in a region A with a width corresponding to the track width to be converted into a single domain in the X direction. A steady-state current is passed from the lead layer 26 into the ferromagnetic layer 24 via the antimagnetic layer 25. When the steady-state current is passed through the ferromagnetic layer 24, a longitudinal bias field in the Z direction caused by magnetostatic coupling energy from the ferromagnetic layer 22 is applied to the ferromagnetic layer 24. If a magnetic leakage field from the magnetic medium is applied to the ferromagnetic layer 24 magnetized by the transverse and longitudinal magnetic bias fields, the electric resistance against the steady-state current varies linearly in proportion to the magnitude of the magnetic leakage field. Therefore, it is possible to detect the magnetic leakage field by detecting the change in the electric resistance.

In the structure shown in FIG. 20, a free ferromagnetic layer 28, a non-magnetic and electrically conductive layer 29, and a ferromagnetic layer 24 are successively formed on a lower insulating layer 21 wherein the free ferromagnetic layer 28, the non-magnetic and electrically conductive layer 29, and the ferromagnetic layer 24 make up a magnetoresistance element. Furthermore, an antiferromagnetic layer 25 and an upper insulating layer 27 are successively formed on the ferromagnetic layer 24.

In the structure shown in FIG. 20, a steady-state current in passed through the magnetoresistance element 19. The magnetization of the ferromagnetic layer 24 is fixed into the Z direction due to the exchange anisotropic coupling with the antiferromagnetic layer 25. If a magnetic leakage field from the magnetic medium moving in the Y direction is applied, the magnetization direction of the free ferromagnetic layer 28 varies, and thus the electric resistance of the magnetoresistance element 19 varies. Therefore, it is possible to detect the magnetic leakage field from the magnetic medium by detecting the change in the electric resistance.

The exchange anisotropic magnetic field generally arises from the exchange interaction of magnetic moments at the interfacial boundary between a ferromagnetic layer and an antiferromagnetic layer. FeMn is well known as an antiferromagnetic material which interacts with a ferromagnetic layer such as a NiFe layer and creates an exchange anisotropic magnetic field. However, FeMn is so poor in corrosion resistance that great degradation in the exchange anisotropic magnetic field occurs due to corrosion which occurs during a production process of a magnetic head and also during the operation of the magnetic head. In some cases, the corrosion damages a magnetic medium. It is known that the temperature in the vicinity of the FeMn layer easily rises to about 120° C. during the operation of the magnetic head due to heat generated by the steady-state detection current. The exchange anisotropic magnetic field produced by the FeMn layer is very sensitive to the change in temperature. That is, the exchange anisotropic magnetic field decreases substantially linearly with the increasing temperature, and the exchange anisotropic magnetic field eventually disappears when the temperature reaches about 150° C. (blocking temperature Tb). This makes it difficult to obtain a stable exchange anisotropic magnetic field.

To solve the above problems, the inventors of the present invention have proposed, in Japanese Patent Application No. 7-78022 filed Apr. 3, 1995, a magnetoresistance device provided with a coercive force enhancement layer made up of $\alpha$-$Fe_2O_3$, having better corrosion resistance and better temperature characteristic than FeMn described above, in which the rotation of magnetization is pinned by the adjacent ferromagnetic layer having an enhanced coercive force. This structure may be employed to obtain a giant magnetoresistance device.

In the magnetoresistance device disclosed in this patent application, two ferromagnetic layers spaced by a non-magnetic layer are formed and a coercive force enhancement layer made up of $\alpha$-$Fe_2O_3$ is disposed adjacent to one of the two ferromagnetic layers so that the rotation of magnetization of said one of the two ferromagnetic layers thereby forming a pinned ferromagnetic layer. The other ferromagnetic layer serves as a free ferromagnetic layer in which the rotation of magnetization is allowed. When an external magnetic field is applied, rotation occurs in the magnetization of the free ferromagnetic layer in response to the applied external magnetic field, and thus corresponding resistance change occurs. Because $\alpha$-$Fe_2O_3$ has a blocking temperature much higher than that of FeMn, the magnetic characteristics of the above magnetoresistance device insensitive to the change in temperature.

Although the above magnetoresistance device provided with the coercive force enhancement layer made up of $\alpha$-$Fe_2O_3$ has advantages described above, it still has some problems to be solved.

In the magnetoresistance device described above, when the layers are formed on a glass substrate in an amorphous form, an R-H curve such as that shown in FIG. 11 is obtained. In this case, although the device shows a large resistance variation ratio, the squareness ratio of the R-H curve is not high enough. Furthermore, the MR variation in a low magnetic field range is not large enough.

Another problem is that the R-H curve shown in FIG. 11 has a narrow plateau region (the top region in the R-H curve) in which the spins of the pinned ferromagnetic layer and the spins of the free ferromagnetic layer become parallel in opposite directions.

Furthermore, in the magnetoresistance device having the above structure, to pin the rotation of magnetization of the pinned ferromagnetic layer, it is required that the thickness of the coercive force enhancement layer of $\alpha$-$Fe_2O_3$ should be larger than 600 Å. This causes an increase in the total thickness of the magnetoresistance device. In other words, it is difficult to realize a thin magnetoresistance device.

SUMMARY OF THE INVENTION

In view of the above, it is an object of the present invention to provide a magnetoresistance device having high corrosion resistance, a high resistance variation ratio, a large squareness ratio, and a high resistance variation ratio in a low magnetic field range, wherein the magnetoresistance device can be realized with layers having a small layer. It is another object of the present invention to provide a method of producing such a magnetoresistance device.

According to an aspect of the present invention to achieve the above object, there is provided a magnetoresistance device comprising at least two ferromagnetic layers separated by a non-magnetic layer, the coercive force of one of the ferromagnetic layers being enhanced by a-coercive force enhancement layer of an antiferromagnetic material disposed adjacent to the one of the ferromagnetic layer thereby pinning magnetization inversion in the one of the ferromagnetic layer, the other ferromagnetic layer serving as a free ferromagnetic layer in which magnetization inversion is allowed, wherein the spin orientation in the coercive force enhancement layer is aligned in a multilayer fashion into a direction substantially parallel to the plane of the coercive force enhancement layer.

According to another aspect of the present invention, there is provided a magnetoresistance device comprising at least two ferromagnetic layers separated by a non-magnetic layer, the coercive force of one of the ferromagnetic layers being enhanced by a coercive force enhancement layer of an antiferromagnetic material disposed adjacent to the one of the ferromagnetic layer thereby pinning magnetization inversion in the one of the ferromagnetic layer, the other ferromagnetic layer serving as a free ferromagnetic layer in which magnetization inversion is allowed, wherein the coercive force enhancement layer is made up mainly of $\alpha$-$Fe_2O_3$ in the form of a single crystal epitaxially grown so that the {0001} surface of the $\alpha$-$Fe_2O_3$ becomes perpendicular to the thickness direction of the antiferromagnetic layer.

According to still another aspect of the present invention, there is provided a magnetoresistance device comprising at least two ferromagnetic layers separated by a non-magnetic layer, the coercive force of one of the ferromagnetic layers being enhanced by a coercive force enhancement layer of an antiferromagnetic material disposed adjacent to the one of the ferromagnetic layer thereby pinning magnetization inversion in the one of the ferromagnetic layer, the other ferromagnetic layer serving as a free ferromagnetic layer in which magnetization inversion is allowed, wherein the coercive force enhancement layer is made up mainly of $\alpha$-$Fe_2O_3$ in the form of a single crystal epitaxially grown so that the {11$\bar{2}$0} surface of the $\alpha$-$Fe_2O_3$ becomes perpendicular to the thickness direction of the antiferromagnetic layer.

According to a further aspect of the present invention, there is provided a magnetoresistance device comprising at least two ferromagnetic layers separated by a non-magnetic layer, the coercive force of one of the ferromagnetic layers being enhanced by a coercive force enhancement layer of an antiferromagnetic material disposed adjacent to the one of the ferromagnetic layer thereby pinning magnetization inversion in the one of the ferromagnetic layer, the other ferromagnetic layer serving as a free ferromagnetic layer in which magnetization inversion is allowed, wherein the coercive force enhancement layer is made up mainly of $\alpha$-$Fe_2O_3$ in the form of a polycrystal, the $\alpha$-$Fe_2O_3$ crystal being uniaxially oriented so that the {0001} surface of the $\alpha$-$Fe_2O_3$ becomes perpendicular to the thickness direction of the antiferromagnetic layer.

According to another aspect of the present invention, there is provided a magnetoresistance device comprising at least two ferromagnetic layers separated by a non-magnetic layer, the coercive force of one of the ferromagnetic layers being enhanced by a coercive force enhancement layer of an antiferromagnetic material disposed adjacent to the one of the ferromagnetic layer thereby pinning magnetization inversion in the one of the ferromagnetic layer, the other ferromagnetic layer serving as a free ferromagnetic layer in which magnetization inversion is allowed, wherein the coercive force enhancement layer is made up mainly of $\alpha$-$Fe_2O_3$ in the form of a polycrystal, the $\alpha$-$Fe_2O_3$ crystal being uniaxially oriented so that the {11$\bar{2}$0} surface of the $\alpha$-$Fe_2O_3$ becomes substantially parallel to the antiferromagnetic layer.

In any of the above structures, the free ferromagnetic layer is preferably magnetized into a signal domain in a direction perpendicular to the magnetization direction of the pinned ferromagnetic layer and parallel to the plane of the free ferromagnetic layer.

Furthermore, it is preferable that Fe of the $\alpha$-$Fe_2O_3$ be partly replaced by one or more elements selected from the group consisting of Ti, V, Cr, Mn, Co, Ni, Cu, and Zn.

According to another aspect of the present invention, there is provided a method of producing a magnetoresistance device, comprising the steps of: preparing a single crystal substrate; forming an epitaxially grown $\alpha$-$Fe_2O_3$ layer serving as a coercive force enhancement layer on the substrate; and further growing a pinned ferromagnetic layer, a non-magnetic layer, and a free ferromagnetic layer.

According to another aspect of the present invention, there is provided a method of producing a magnetoresistance device, comprising the steps of: preparing a polycrystalline substrate; forming an uniaxially oriented $\alpha$-$Fe_2O_3$ layer serving as a coercive force enhancement layer on the substrate; and further growing a pinned ferromagnetic layer, a non-magnetic layer, and a free ferromagnetic layer.

Preferably, the single crystal substrate of the polycrystalline substrate described above has a surface which provides good lattice matching with the {11$\bar{2}$0} or {0001} surface of the $\alpha$-$Fe_2O_3$ layer grown on the surface.

Furthermore, Fe of the $\alpha$-$Fe_2O_3$ making up the coercive force enhancement layer may be partly replaced by one or more elements selected from the group consisting of Ti, V, Cr, Mn, Co, Ni, Cu, and Zn.

DESCRIPTION OF THE PREFERRED EMBODIMENTS

The present invention will be described in further detail below with reference to preferred embodiments in conjunction with the accompanying drawings.

Figure 1:
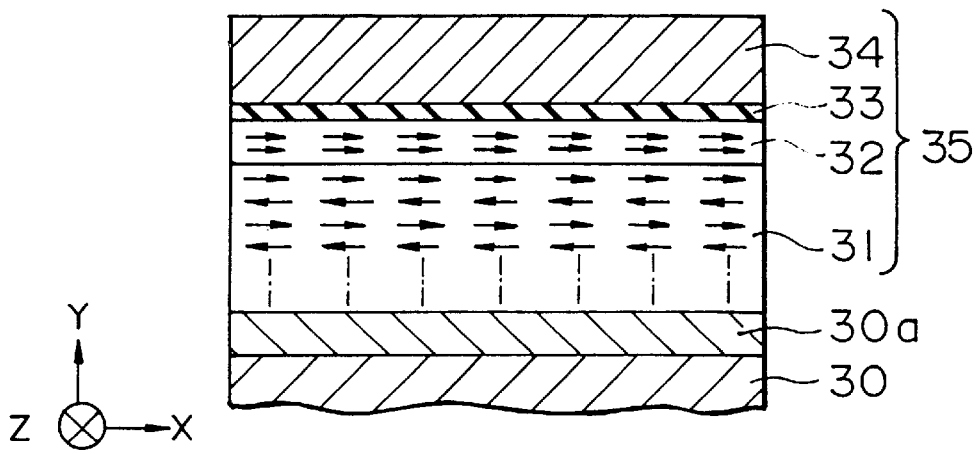
FIG. 1 is a cross-sectional view illustrating a first embodiment of a magnetoresistance device according to the present invention.

FIG. 1 illustrates an embodiment of a magnetoresistance device according to the present invention. As shown in FIG. 1, after forming a buffer layer 30a on a substrate 30 made up of a single crystal or polycrystal, a coercive force enhancement layer 31, a ferromagnetic layer 32, a non-magnetic layer 33, and a ferromagnetic layer 34 are successively formed into a multilayer structure thereon. In this structure, the coercive force enhancement layer 31, the ferromagnetic layer 32, the non-magnetic layer 33, and the ferromagnetic layer 34 make up a magnetoresistance element 35.

The material for the substrate 30 should be properly selected so that $\alpha$-$Fe_2O_3$ making up the coercive force enhancement layer 31, which will be described in detail later, can be epitaxially grown on the substrate 30. More specifically, Si having a diamond structure, MgO having a rock salt structure, $MgAl_2O_4$ having a spinel structure, gadolinium garnet ($Gd_3Ga_5O_{12}$) having a garnet structure, sapphire ($\alpha$-$Al_2O_3$) having the same corundum structure as $\alpha$-$Fe_2O_3$, or $\alpha$-$Fe_2O_3$ in the form of a single crystal in the hexagonal system may be employed as a preferable material to form the substrate 30.

Although the substrate 30 may be formed of a proper material selected from the above group, it is required that the substrate 30 should be grown to have a particular crystal orientation.

Figure 2:
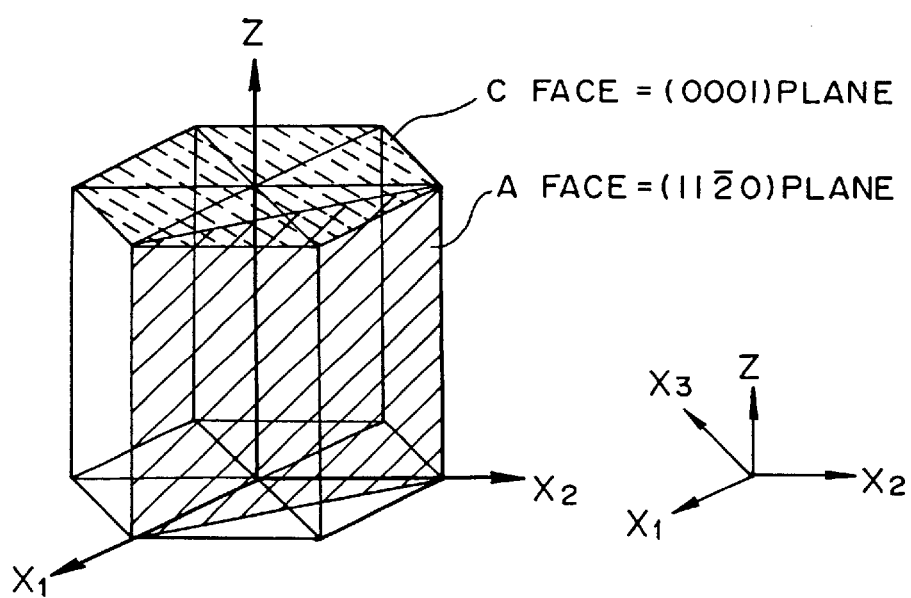
FIG. 2 is a schematic diagram illustrating an unit cell in the hexagonal system and also illustrating some plane orientations thereof.

That is, the substrate 30 should have good lattice matching with the $\{0001\}$ or $\{01\bar{2}0\}$ surface of the $\alpha$-$Fe_2O_3$ grown thereon. For example, when the substrate 30 is formed of a material having a crystal structure in the hexagonal system, it is required that the crystal is grown so that the upper surface (the surface of the grown layer) becomes a C surface (when, as shown in FIG. 2, basic lateral axes of a crystal lattice in the hexagonal system are denoted by $X_1$, $X_2$, and $X_3$, and the ordinate axis is denoted by Z, the C surface is defined as a $\{0001\}$ surface perpendicular to the Z axis), or so that the upper surface (the surface of the grown layer) becomes a $\{11\bar{2}0\}$ of the crystal structure in the hexagonal system. In the present description, the axes of the crystal lattice structure in the hexagonal system are denoted by $X_1$, $X_2$, $X_3$, and Z as shown in FIG. 2, and the negative directions along these axes are denoted by overlines over corresponding indexes.

In FIG. 2, for example, a plane intersecting the $X_1$ axis at 1, the $X_2$ axis at 1, the $X_3$ axis at $-1/2$ is represented by $(11\bar{2}0)$. Those planes which are crystallographically equivalent to $11\bar{2}0$), such as $(1\bar{2}10)$, $(\bar{2}110)$, $(\bar{1}2\bar{1}0)$, $(2\bar{1}\bar{1}0)$, $(\bar{1}\bar{1}20)$, $(11\bar{2}0)$, are generically represented by $\{11\bar{2}0\}$. In FIGS. 2, 9, 10, and 12, in addition to the notation described above, other notation commonly used in crystallography is also used.

The buffer layer 30a may be formed of a film material such as $\alpha$-$Al_2O_3$ having a corundum structure as $\alpha$-$Fe_2O_3$, or metal such as Co having a crystal structure in the hexagonal system. The buffer layer 30a serves to protect and planarize the surface of the substrate 30, whereas the buffer layer 30a is not essential and may be removed.

The coercive force enhancement layer 31 serves to enhance the coercive force of the ferromagnetic layer 32 adjacent to the coercive force enhancement layer 31 by means of exchange magnetic interaction with the ferromagnetic layer 32 thereby pinning the orientation of magnetization. The coercive force enhancement layer 31 is preferably formed of an antiferromagnetic material, and more preferably of an oxide antiferromagnetic material, such as $\alpha$-$Fe_2O_3$. The coercive force enhancement layer 31 is epitaxially grown on the substrate 30 or grown in an uniaxially oriented form.

It is preferable that the spin orientation in the coercive force enhancement layer 31 be aligned into a direction substantially parallel to the plane of the coercive force enhancement layer 31 and furthermore it is preferable that the spin orientation in the coercive force enhancement layer 31 be aligned into a multilayer form.

The ferromagnetic layers 32 and 34 are both made up of a thin film of a ferromagnetic material such as a Ni—Fe alloy, a Co—Fe alloy, a Ni—Co alloy, Co, a Ni—Fe—Co alloy. For example, the ferromagnetic layer 32 may be made up of a Co layer and the ferromagnetic layer 34 may be made up of a Ni—Fe alloy layer or formed into a multilayer structure consisting of a Co layer and a Ni—Fe alloy layer. In the case where the ferromagnetic layer 34 is formed into a two-layer structure consisting of a Co layer and a Ni—Fe alloy layer, a thin Co layer may be disposed adjacent to the non-magnetic layer 33.

In the giant magnetoresistance structure consisting of the ferromagnetic layers 32 and 34 and the non-magnetic layer 33 disposed between the ferromagnetic layers 32 and 34, if both the ferromagnetic layers 32 and 34 are made up of the same kind of material, conduction electrons encounter less scattering other than spin-dependent scattering and it is possible to achieve a higher magnetoresistance effect than in the case wherein the ferromagnetic layers 32 and 34 are formed of different kinds of material. That is, the interface between Co and Cu can have greater spin-dependent scattering and thus a greater magnetoresistance effect than the interface between Ni—Fe and Cu can have. For the above reason, when the ferromagnetic layer 32 is made up of Co, it is preferable that a part of the ferromagnetic layer 34 adjacent to the non-magnetic layer 33 be replaced by a Co layer over a proper thickness. Instead of forming a separate Co layer in the ferromagnetic layer 34, the ferromagnetic layer 34 may be formed of an alloy whose composition gradually varies with the position in such a manner that a greater amount of Co is contained near the non-magnetic layer 33 and the Co content gradually decreases toward the upper protective layer 37.

Although the rotation of magnetization of the ferromagnetic layer 32 is pinned as described above, the ferromagnetic layer 34 is free in rotation of magnetization, and therefore it is desirable that the ferromagnetic layer 34 be magnetized into a single magnetic domain.

The non-magnetic layer 33 is made up of a non-magnetic material such as Cu, Cr, Au, or Ag, with a thickness of 20 to 40 Å. If the thickness of the non-magnetic layer 33 is less than 20 Å, the magnetic coupling between the ferromagnetic layer 32 and the ferromagnetic layer 34 becomes strong. On the other hand, if the thickness of the non-magnetic layer 33 is greater than 40 Å, a reduction occurs in the scattering rate of conduction electrons at the interface between the non-magnetic layer 33 and the ferromagnetic layer 32 and at the interface between the non-magnetic layer 33 and the ferromagnetic layer 34. The scattering at these interfaces is an important factor of the magnetoresistance effect, and thus the reduction in the scattering rate causes diversion of current and thus a reduction in the magnetoresistance effect.

In the structure shown in FIG. 1, a steady-state current is passed through the magnetoresistance element 35.

In the case of the structure shown in FIG. 1, the coercive force enhancement layer 31 exerts exchange magnetic coupling on the ferromagnetic layer 32 thereby enhancing the coercive force of the ferromagnetic layer 32 thus pinning the magnetization orientation. On the other hand, the rotation of magnetization of the ferromagnetic layer 34 becomes free. As a result, a difference in coercive force occurs between the ferromagnetic layers 32 and 34 and thus a giant magnetoresistance effect is achieved. That is, if an external magnetic field such a magnetic leakage field from a magnetic recording medium moving in the Y direction in FIG. 1 is applied to the ferromagnetic layer 34 which is made free in the rotation of magnetization, the orientation of magnetization of the ferromagnetic layer 34 easily rotates and thus the resistance of the magnetoresistance element 35 changes in response to the rotation. Therefore, it is possible to read magnetic information from the magnetic recording medium by detecting the change in resistance.

If the ferromagnetic layer 34 has a single magnetic domain, the resistance change occurs without generating Barkhausen noise and the resistance changes linearly in response to the applied magnetic field.

In the structure shown in FIG. 1, the substrate 30 has an upper surface which is sufficiently low in lattice mismatch with the (0001) or (11$\bar{2}$0) plane of α-$Fe_2O_3$ having the corundum structure, and the coercive force enhancement layer 31 is either epitaxially grown on the substrate 30 such that the epitaxially grown layer has a crystal orientation consistent with the crystal orientation of the substrate 30 or grown in an uniaxially oriented fashion. As a result, the spins are aligned into a multilayer form in a direction parallel to the plane of the coercive force enhancement layer 31.

It is known that the spin direction of an α-$Fe_2O_3$ bulk, transition in spin direction occurs at the Moline point. It is also known that the Moline point of α-$Fe_2O_3$ in the form of a bulk is 260 K. which is close to room temperature. However, in the case of α-$Fe_2O_3$ in the form of a thin film, the Moline point is influenced by defects or impurities induced or introduced during the film growth process and also influenced by heat treatment, and therefore the Moline point varies from film to film depending on the film growth conditions. Therefore, it is desirable to properly select the crystal orientation of the substrate 30 either to {0001} or {11$\bar{2}$0} depending on the Moline point of the coercive force enhancement layer 321.

If a thin film of α-$Fe_2O_3$ is formed by means of sputtering under common conditions, the resultant film has a Moline point close to room temperature. In this case it is preferable to employ a {11$\bar{2}$0} substrate 30.

If Fe of α-$Fe_2O_3$ is partly replaced by one or more elements selected from the group consisting of Ti, V, Cr, Mn, Co, Ni, Cu, and Zn, the Moline point decreases. Therefore, if the Moline point is reduced to a sufficiently low value relative to room temperature by adding some element selected from the above group, the orientation of spins of the coercive force enhancement layer formed on the {0001} substrate 30 are aligned as shown in FIG. 1.

In this way, it is possible to obtain a magnetoresistance element 35 including a coercive force enhancement layer 31 in which spins are aligned into a multilayer form as shown in FIG. 1. Such a magnetoresistance element 35 has a great squareness ratio and a great resistance change at a low magnetic field range. Furthermore, since the spins of the coercive force enhancement layer 31 are aligned into the multilayer form in a direction parallel to the layer plane, the coercive force enhancement layer 31 has a strong pinning effect on the ferromagnetic layer 32. Therefore, the coercive force enhancement layer 31 is not needed to have a large thickness such as 600 Å. For example, 200 Å or greater is enough to obtain a sufficient pinning effect. This makes it possible to reduce the thickness of the coercive force enhancement layer 31 and thus it is possible to reduce the total thickness of the magnetoresistance element 35.

Furthermore, in the structure shown in FIG. 1, when no external magnetic field is applied, the pinned ferromagnetic layer 32 and the free ferromagnetic layer 34 are magnetized into directions perpendicular to each other. This makes it possible to achieve a center bias with no hysteresis in the hard direction of magnetization of the free ferromagnetic layer 34. Such the magnetoresistance element is very easy to handle.

Furthermore, in the structure shown in FIG. 1, the coercive force enhancement layer 31 is made up of α-$Fe_2O_3$ which is an oxide having high resistance to corrosion compared with FeMn and having a high Neel temperature. Thus, the coercive force enhancement layer 31 is insensitive to the change in temperature.

In the device structure shown in FIG. 1, although the coercive force enhancement layer 31 is made up of α-$Fe_2O_3$, the coercive force enhancement layer 31 may also be made up of other material such as an antiferromagnetic material, oxide antiferromagnetic material, or high coercive force magnetic material, as long as the material has the capability of exerting exchange magnetic interaction on the ferromagnetic layer 32 thereby enhancing the coercive force.

Figure 3:
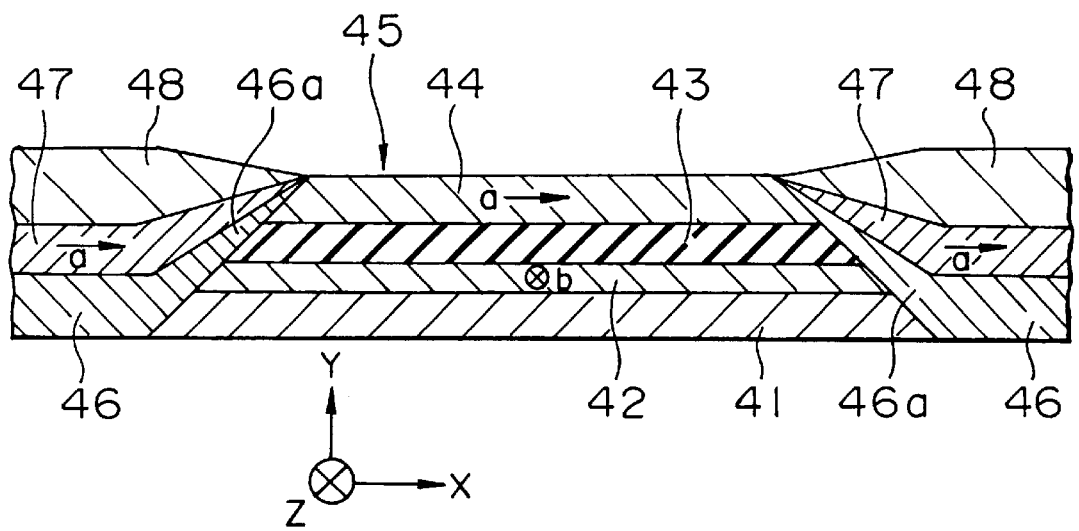
FIG. 3 is a cross-sectional view of a thin-film magnetic head including the magnetoresistance device shown in FIG. 1.

FIG. 3 illustrates another embodiment of a magnetoresistance device according to the present invention. The magnetoresistance device of this embodiment comprises a multilayer element 45 formed on a substrate wherein the multilayer film 45 is trapezoidal in cross section and consists of a coercive force enhancement layer 41, a pinned ferromagnetic layer 42, a non-magnetic layer 43, and a free ferromagnetic layer 44. At either side of the multilayer element, antiferromagnetic layers 46 are disposed, and a ferromagnetic layer 47 and a conductive layer 48 are successively formed into a multilayer structure on each antiferromagnetic layer 46. In this embodiment, an end portion 46a of each antiferromagnetic layer 46 covers the side faces of the antiferromagnetic layer 41, the pinned ferromagnetic layer 42, and the non-magnetic layer 43 at either side, and also covers the lower half of the side face of the free ferromagnetic layer 44. An end portion of the ferromagnetic layer 47 on each antiferromagnetic layer 46 covers the upper half of the side face of the free ferromagnetic layer 44 at either side. The relative thicknesses of the respective layers are not limited to those shown in the figure.

In this structure, the coercive force enhancement layer 41 is formed of a material similar to that employed to form the coercive force enhancement layer 31 of the previous embodiment. The pinned ferromagnetic layer 42 is formed of a material similar to that employed to form the ferromagnetic layer 32 of the previous embodiment. The non-magnetic intermediate layer 43 is formed of a material similar to that employed to form the non-magnetic layer 33 of the previous embodiment. The free ferromagnetic layer 44 is formed of a material similar to that employed to form the ferromagnetic layer 34 of the previous embodiment. The antiferromagnetic layer 46 is formed of a material such as NiMn, PtMn, RuMn, RhMn, PdMn, or IrMn. Furthermore, it is preferable that the ferromagnetic layer 47 is formed of a material such as CoNbZr or CoTaHf in an amorphous form.

In the structure shown in FIG. 3, the magnetization direction of the ferromagnetic layer 47 is pinned into a direction denoted by the arrow an in FIG. 3 due to the unidirectional anisotropy of the antiferromagnetic layer 46. Furthermore, the orientation of magnetization of the free ferromagnetic layer 44 is induced into the same direction as the orientation of magnetization of the ferromagnetic layer 47, as denoted by the arrow a. Furthermore, the direction of magnetization of the ferromagnetic layer 42 is pinned by the coercive force enhancement layer 41 into a direction denoted by the arrow b in FIG. 3.

As described above, it is possible to magnetize the free ferromagnetic layer 44 and the ferromagnetic layer 47 into a single domain in such a manner that the magnetization direction of the free ferromagnetic layer 44 becomes perpendicular to the magnetization direction of the pinned ferromagnetic layer 42.

If the ferromagnetic layer 47 is made up of an amorphous ferromagnetic material, it is possible to suppress the side reading effect (reading of a magnetic field from a part other than tracks of a magnetic medium), because the amorphous ferromagnetic layer has little magnetoresistance effect. Another advantage of the amorphous ferromagnetic layer 47 is that there is little dispersion in the unidirectional anisotropy.

In the structure of the present embodiment, as in the previous embodiment, since the free ferromagnetic layer 44 is magnetized into a single domain and a longitudinal bias is applied, good linearity is obtained in resistance change without producing Barkhausen noise.

Figure 4:
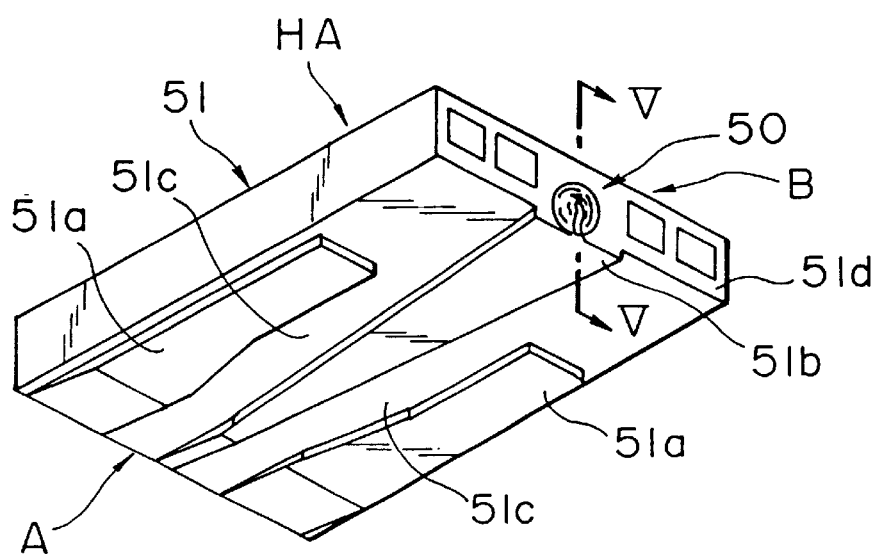
FIG. 4 is a perspective view illustrating an example of a thin-film magnetic head provided with the device shown in FIG. 3.
Figure 5:
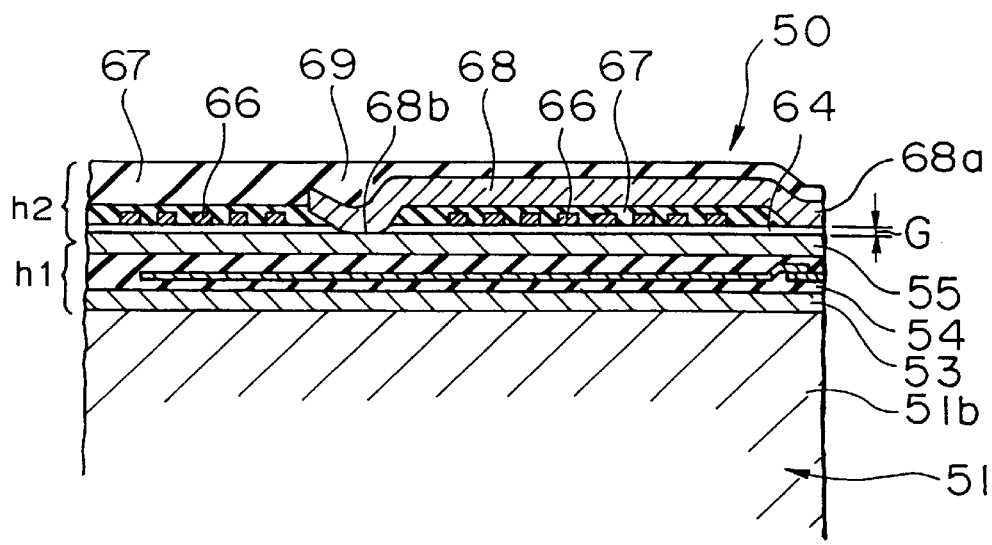
FIG. 5 is a cross-sectional view of the thin-film magnetic head shown in FIG. 4.
Figure 6:
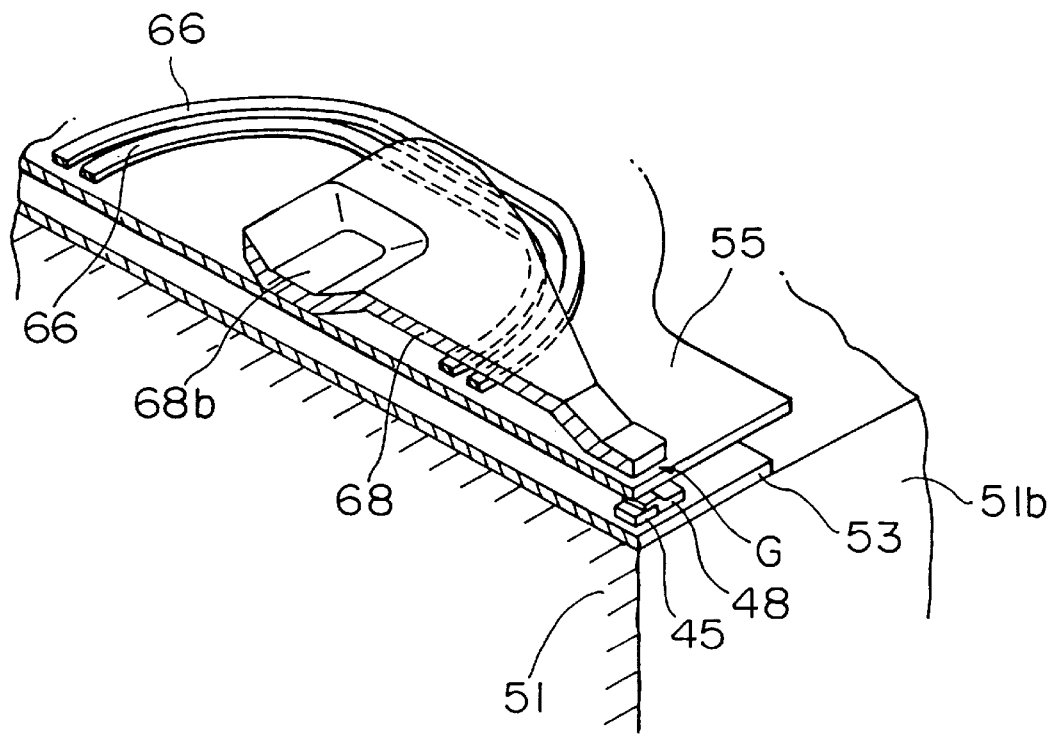
FIG. 6 is a perspective view, partially cross sectioned, of the thin-film magnetic head shown in FIG. 4.

FIGS. 4–6 illustrate an example of a thin-film magnetic head having the device structure shown in FIG. 3.

The magnetic head HA shown in these figures is of the noncontact (flying) type for use in a hard disk drive or the like. This magnetic head HA has a slider 51 whose leading end denoted by (A) in FIG. 4 faces against the upstream direction of disk surface movement, while the trailing end of the slider 51 is denoted by (B) in FIG. 4. Rail-shaped ABS surfaces 51a, 51a, and 51b and air grooves 51c are formed on the slider's surface facing a disk.

The thin-film magnetic head 50 is disposed on the trailing end face 51d of the slider 51.

In this specific embodiment, the thin-film magnetic head 50 is of a combined type whose cross-sectional view is shown in FIGS. 5 and 6. As shown in these figures, an MR head (reading head) $h_1$ and an inductive head (writing head) $h_2$ are formed successively on the trailing end face 51d of the slider 51.

The MR head $h_1$ in this specific example detects a leakage flux from a recording medium such as a disk by means of the magnetoresistance effect, thereby reading a magnetic signal. In the MR head $h_1$, as shown in FIG. 5, a lower gap layer 53 of a magnetic alloy such as Sendust (Fe—Al—Si) is formed on the trailing end of the slider 51, and an upper gap layer 54 of a non-magnetic material such as alumina ($Al_2O_3$) is further formed thereon. On this upper gap layer 54, a magnetoresistance element having a structure shown in FIG. 1 or 3 and serving as a giant magnetoresistance element is further formed in a multilayer fashion. On it, an upper gap layer of alumina or the like is formed, and an upper shielding layer is further formed thereon. This upper shielding layer is also used as a lower core layer 55 of the inductive head $h_2$ disposed thereon.

In the inductive head $h_2$, a gap layer 64 is formed on the lower core layer 55, and a coil layer 66 patterned into a flat spiral shape is further formed thereon in such a manner that the coil layer 66 is embedded in an insulating layer 67. An upper core layer 68 is formed on the insulating layer 67 in such a manner that its end part 68a faces the lower core layer 55 via a small gap at the ABS surface 51b and in such a manner that the base portion 68b of the upper core layer 68 is magnetically coupled with the lower core layer 55. A protective layer 69 made up of alumina is disposed on the upper core layer 68.

In the inductive head $h_2$, a recording current is passed into the coil layer 66, and the recording current is then further passed from the coil layer 66 into the core layer. A magnetic signal is recorded onto a recording medium such as a hard disk by means of a leakage flux occurring between the end part of the lower core layer 55 and the end part of the upper core layer 68 at the magnetic gap G.

In the MR head $h_1$, the resistance of the ferromagnetic layer 44 varies in response to a small amount of leakage flux from a recording medium such as a hard disk and thus it is possible to read the information recorded on the recording medium by detecting the change in the resistance.

Furthermore, since the magnetoresistance element having the structure described earlier is employed in this magnetic head HA, no Barkhausen noise is generated and good linearity can be obtained in the resistance change. Furthermore, the present magnetic head HA has a higher MR ratio than can be obtained with the conventional magnetic head, and therefore it has excellent reading performance.

The magnetoresistance element having the structure shown in FIG. 1 may be produced as follows. A substrate of a single crystal sapphire or the like in the form of a plate is placed in a chamber of a high frequency magnetron sputtering apparatus or an ion beam sputtering apparatus, and the atmosphere inside the chamber is replaced by an inert gas such as Ar. After that, various films required to form the magnetoresistance element are successively deposited. As for the targets used to deposit the films, an $\alpha$-$Fe_2O_3$ target, a Ni—Fe alloy target, a Cu target, etc., may be employed.

The coercive force enhancement layer 31 of $\alpha$-$Fe_2O_3$ may also be formed using evaporation or CVD instead of the sputtering technique. Furthermore, assistive process such as heating of the substrate, application of a magnetic bias field, or ion irradiation may be performed during the film deposition.

On the other hand, the magnetoresistance element of the present invention shown in FIG. 3 may be produced as follows. The coercive force enhancement layer 41 of $\alpha$-$Fe_2O_3$ is formed on the substrate by means of sputtering in a magnetic field and in an Ar gas atmosphere with a pressure less than 3 mTorr. Using the photolithography and ion milling techniques, the layers are removed except for those portions corresponding to the track width thereby forming the multilayer structure 45. While applying a magnetic field in a direction perpendicular to the direction in which the magnetic field is applied in the above process, sputtering is performed so that the antiferromagnetic layer 46, the amorphous ferromagnetic layer 47, and the electrode layer 48 are successively deposited at both sides of the multilayer structure 45. Subsequently, a magnetic field is applied in a direction perpendicular to the page of FIG. 3, thereby magnetizing the pinned ferromagnetic layer 42.

Thus, the magnetoresistance element having the structure shown in FIG. 3, in which the magnetization direction of the pinned ferromagnetic layer 42 and the magnetization direction of the ferromagnetic layer 44 are perpendicular to each other, is obtained.

EXAMPLES

Using a high frequency magnetron sputtering apparatus while applying a magnetic field of 100 Oe in one direction parallel to the substrate surface (in a direction denoted by the arrow X in FIG. 1), a multilayer film was formed on a sapphire substrate so that the multilayer film has the following structure and thickness. The multilayer film was formed so that it had the structure consisting of substrate// $\alpha$-$Fe_2O_3$ (with a thickness of about 100 nm)/NiFe (5.8 nm)/Cu (2.2 nm)/NiFe (8.7 nm). As for the sapphire substrate, a sapphire substrate with a (11$\bar{2}$0) surface and a sapphire substrate with a (0001) surface were employed, and a coercive force enhancement layer was epitaxially grown on each sapphire substrate. Furthermore, for the purpose of comparison, a similar magnetoresistance element was also produced on a substrate made up of glass, that is, on an amorphous substrate.

The obtained samples were evaluated as follows. RHEED (reflection high energy electron diffraction) was used to evaluate the crystal quality of the epitaxially grown α-Fe$_2$O$_3$ layer serving as the coercive force enhancement layer. The giant magnetoresistance effect was evaluated on the basis of the MR curve measured by means of the direct-current four terminal method.

Figure 7:
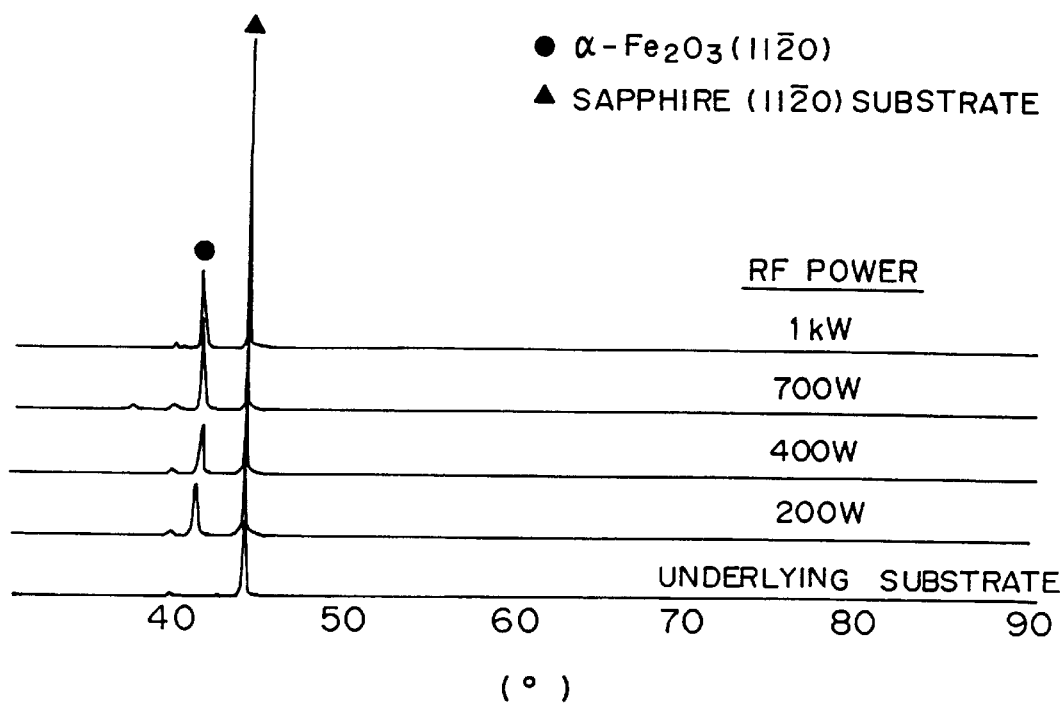
FIG. 7 illustrates an X-ray diffraction pattern of an $\alpha$-$Fe_2O_3$ formed on a (11$\bar{2}$0) sapphire substrate.
Figure 8:
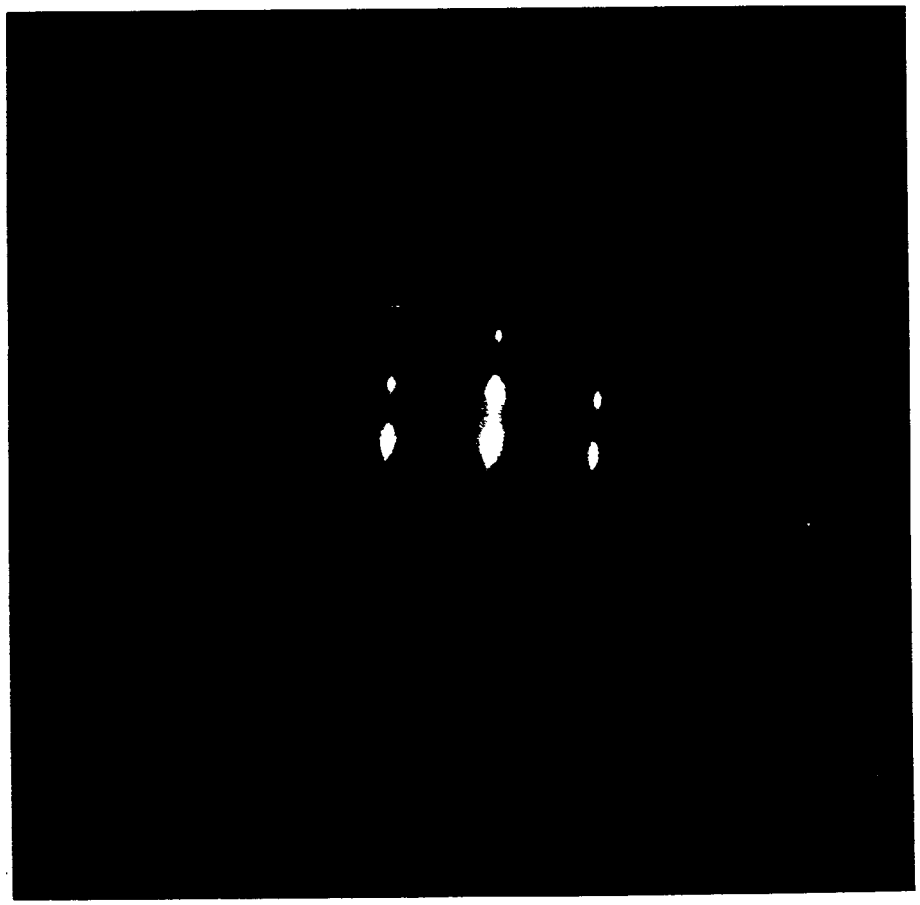
FIG. 8 is a RHEED pattern photograph representing the crystal structure of the $\alpha$-$Fe_2O_3$ formed on the (11$\bar{2}$0) sapphire substrate.

Samples each having a coercive force enhancement layer of α-Fe$_2$O$_3$ with a thickness of 4000 Å formed on a (11$\bar{2}$0) sapphire substrate were produced with various RF power including 200 W, 400 W, 700 W, and 1000 W, and the XRD pattern of the coercive force enhancement layer of each sample was evaluated. FIG. 7 illustrates XRD patterns for these samples, obtained by the measurement based on the θ–2θ technique. FIG. 8 illustrates a RHEED pattern of the α-Fe$_2$O$_3$ coercive force enhancement layer formed with RF power of 400 W.

As can be seen from FIG. 7, a diffraction peak corresponding to the (11$\bar{2}$0) plane of α-Fe$_2$O$_3$ and a diffraction peak corresponding to the (11$\bar{2}$0) plane of the sapphire substrate were observed for each sample. Furthermore, as shown in FIG. 8, a spot pattern with streaks was observed in the RHEED measurement. These measurement results indicated that α-Fe$_2$O$_3$ was epitaxially grown into the form of a single crystal on the substrate such that the α-Fe$_2$O$_3$ crystal was grown into the same orientation as that of the substrate. On the other hand, the XRD pattern for the coercive force enhancement layer of α-Fe$_2$O$_3$ formed on the glass substrate has revealed that it is polycrystalline form with no orientation.

The MR curve measurement results for magnetoresistance elements produced on various substrates are shown in FIGS. 9–12.

Figure 9:
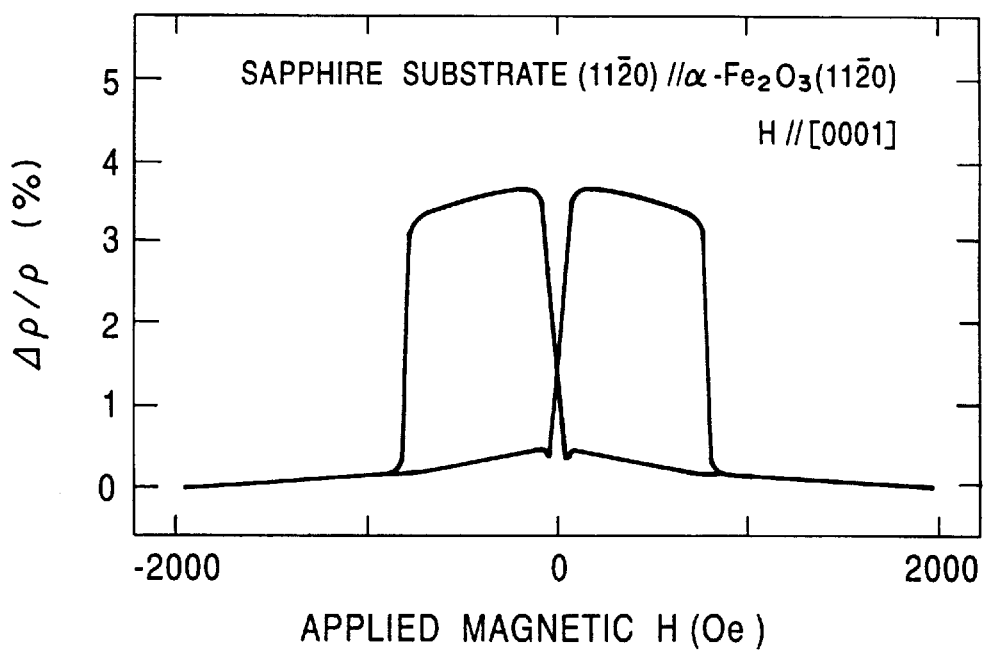
FIG. 9 is a graph illustrating the change in resistance as a function of the magnetic field applied in the [0001] direction to a sample having a (11$\bar{2}$0) $\alpha$-$Fe_2O_3$ layer grown on a (11$\bar{2}$0) sapphire substrate.
Figure 10:
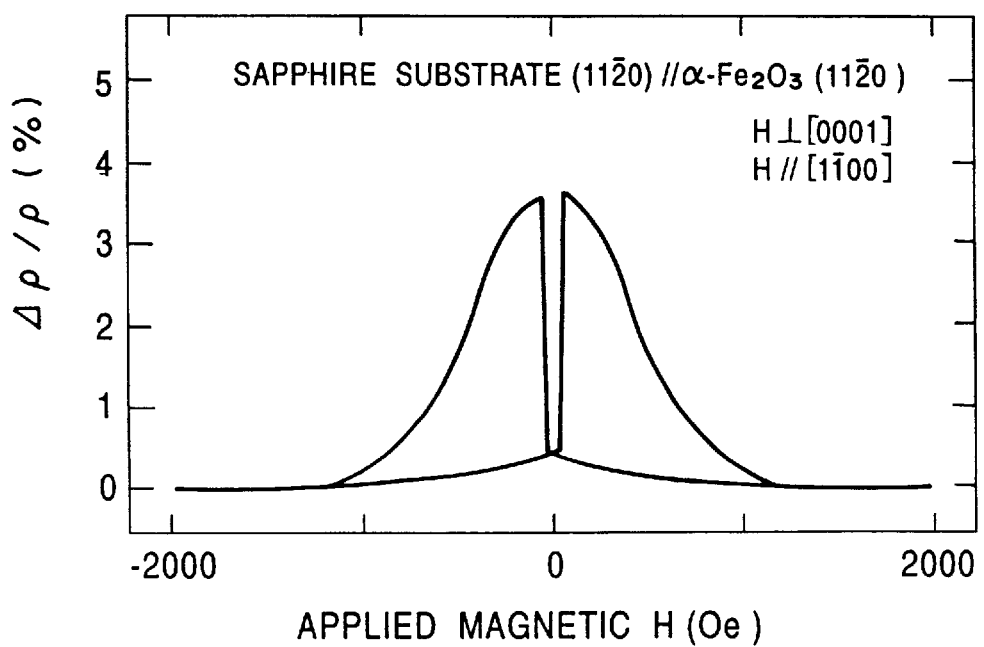
FIG. 10 is a graph illustrating the change in resistance as a function of the magnetic field applied in the [1$\bar{1}$00] direction to the sample having the (11$\bar{2}$0) $\alpha$-$Fe_2O_3$ layer grown on the (11$\bar{2}$0) sapphire substrate.
Figure 11:
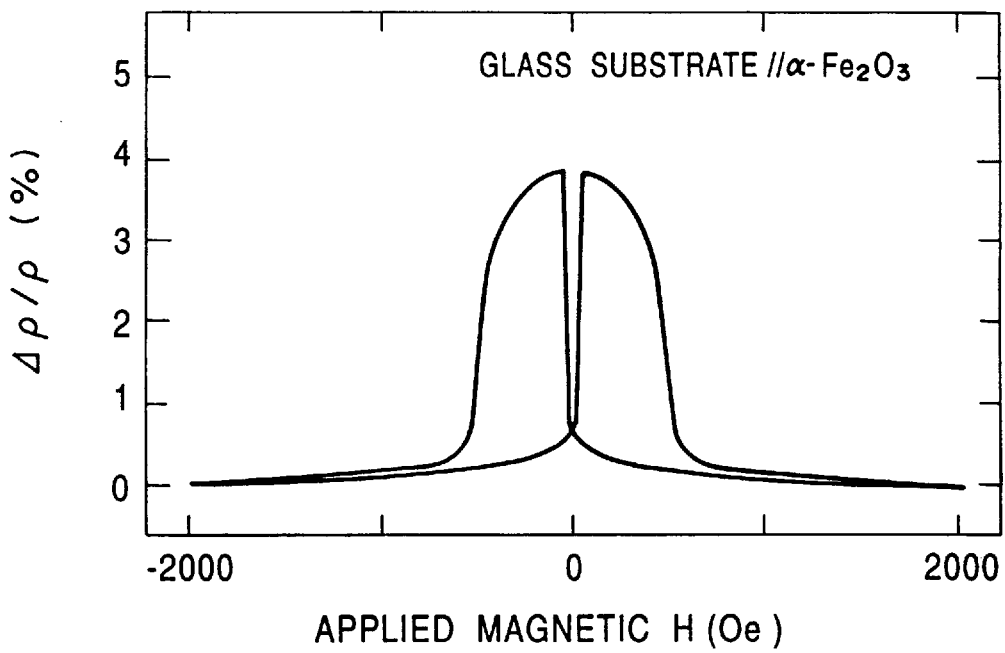
FIG. 11 is a graph illustrating the change in resistance as a function of the applied magnetic field for a sample having an $\alpha$-$Fe_2O_3$ layer formed on a glass substrate.
Figure 12:
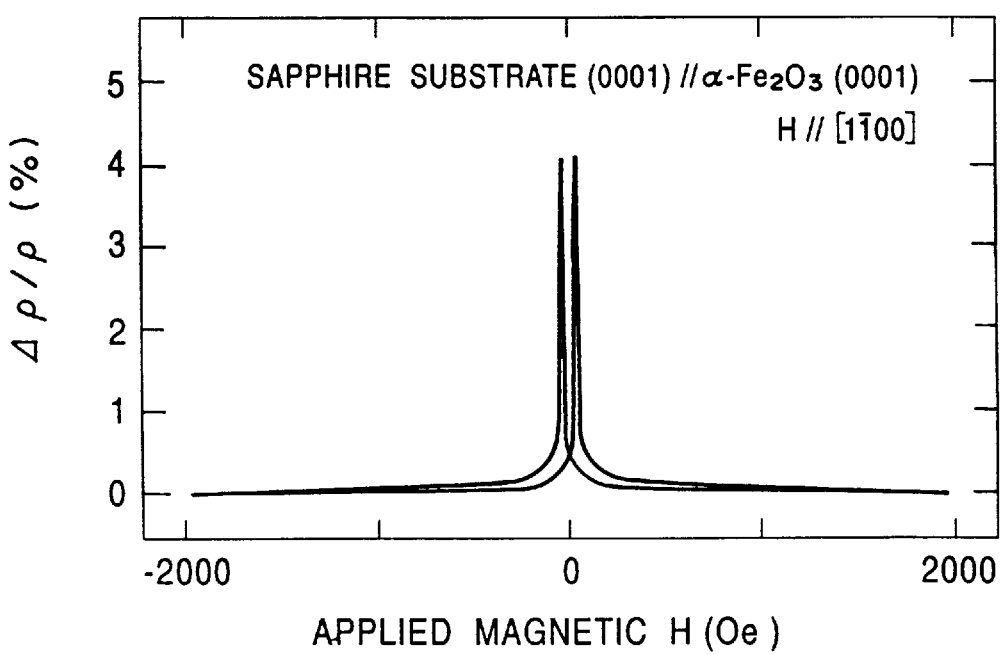
FIG. 12 is a graph illustrating the change in resistance as a function of the magnetic field applied in a direction parallel to the [1$\bar{1}$00] direction to a sample having a (0001) $\alpha$-$Fe_2O_3$ layer grown on a (0001) sapphire substrate.

FIG. 9 shows the MR change as a function of the magnetic field applied to a sample in which (11$\bar{2}$0) α-Fe$_2$O$_3$ was epitaxially grown on a (11$\bar{2}$0) sapphire substrate wherein the magnetic field was applied in a direction parallel to the [0001] direction. FIG. 10 shows the MR change as a function of the magnetic field applied in a direction perpendicular to the [0001] direction for the same sample. FIG. 11 shows the MR change as a function of the magnetic field applied to a sample in which α-Fe$_2$O$_3$ was grown on a glass substrate wherein the magnetic field was applied in the same direction as that in which a magnetic field was applied during the process of growing α-Fe$_2$O$_3$. FIG. 12 shows the MR change as a function of the magnetic field applied to a sample in which (0001) α-Fe$_2$O$_3$ was epitaxially grown on a (0001) sapphire substrate wherein the magnetic field was applied in the [1$\bar{1}$00] direction.

As can be seen from FIG. 9, each sample having a coercive force enhancement layer according to the present invention shows an R-H curve in which an abrupt change in resistance occurs in a low magnetic field range. Furthermore, the pinned ferromagnetic layer of NiFe has a large coercive force H$_{cp}$ and also has a high enough squareness ratio. Therefore, the R-H curve has wide plateau regions (having a flat top) in which the magnetization of the pinned ferromagnetic layer and that of the free ferromagnetic layer become parallel in opposite direction. This is because spins are uniformly aligned in one direction in the single crystal of α-Fe$_2$O$_3$ serving as the coercive force enhancement layer with substantially no spin dispersion.

FIG. 10 illustrates the MR characteristic for the same sample wherein the magnetic field is applied in the [1$\bar{1}$00] direction perpendicular to the [0001] direction employed in the measurement shown in FIG. 9. The MR curve shown in FIG. 10 is very different from that shown in FIG. 9. This indicates that the pinned ferromagnetic layer has an easy magnetization axis in the [0001] direction.

On the other hand, although a sample having a magnetoresistance element formed on a glass substrate has a magnetoresistance property, the squareness ratio is small and the plateau region is narrow as can be clearly seen from FIG. 11.

FIG. 12 illustrates the MR curve of a sample having a (0001) α-Fe$_2$O$_3$ single crystal layer formed on a (0001) sapphire substrate. The pinned ferromagnetic layer of NiFe of this sample has a low coercive force H$_{cp}$, and the magnetization of the pinned ferromagnetic layer and that of the free ferromagnetic layer become parallel in opposite direction only in a very limited range of the applied magnetic field. The MR curve was measured for this sample for various directions of the applied magnetic field within the film plane of the (0001) α-Fe$_2$O$_3$ single crystal. However, no change was observed in the coercive force H$_{cp}$ of the pinned ferromagnetic layer.

From the above evaluation result, it can be concluded that the (0001) α-Fe$_2$O$_3$ single crystal layer formed according to the above-described technique has a spin axis directed in [0001] at room temperature. This is different from the spin structure that a bulk of α-Fe$_2$O$_3$ normally has at room temperature. The above difference can be understood if it is assumed that the coercive force enhancement layer magnetically behaves in a similar fashion to the behavior of α-Fe$_2$O$_3$ in a bulk form at temperatures lower than the Moline point (260 K.) at which transition in spin orientation occurs. That is, the Moline point of the coercive force enhancement layer produced in the above-described manner increases to a value higher than room temperature due to the defects or impurities induced or introduced during the production process or due to the effect of heat treatment during the production process. When a (0001) α-Fe$_2$O$_3$ layer serving as the coercive force enhancement layer is epitaxially grown on a (0001) substrate, if one or more kinds of elements selected from the group consisting of Ti, V, Cr, Mn, Co, Ni, Cu, and Zn are added to the α-Fe$_2$O$_3$ layer and furthermore the film growing conditions are properly selected so that the resultant coercive force enhancement layer has a low enough Moline point, it is possible to obtain a magnetoresistance element having a high MR ratio as shown in FIG. 9.

Figure 13:
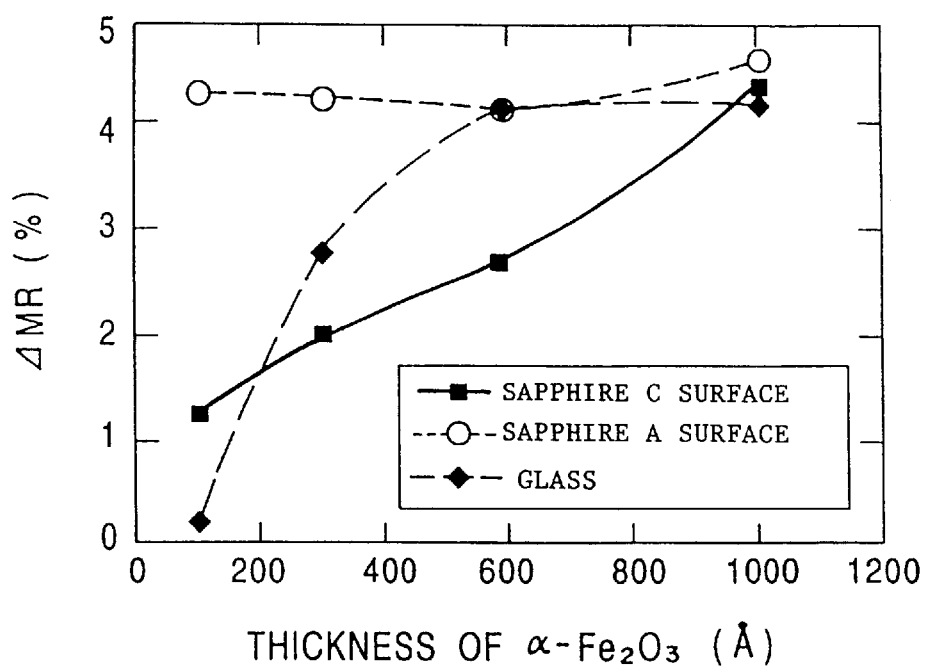
FIG. 13 is a graph illustrating the dependence of the thickness of the $\alpha$-$Fe_2O_3$ layer on the $\Delta$MR for samples having an $\alpha$-$Fe_2O_3$ layer epitaxially grown on the C surface of a sapphire substrate, the A surface of a sapphire substrate, and a glass substrate, respectively.

FIG. 13 illustrates the measured variation in MR (ΔMR) as a function of the thickness of α-Fe$_2$O$_3$ in the range from 100 to 1000 Å for a sample having a (11$\bar{2}$0) α-Fe$_2$O$_3$ layer epitaxially grown on the (11$\bar{2}$0) surface (A surface) of a sapphire substrate and also for a sample having a (0001) layer epitaxially grown on the (0001) surface (C surface) of a sapphire substrate. For these samples, the Δmr/ΔMR ratio, which reflects the degree of the squareness ratio of the pinned ferromagnetic layer, was also measured and the result is shown in FIG. 14 as a function of the thickness (wherein ΔMR is the relative change in MR which occurs when the applied magnetic field is changed over ±2 k Oe, and Δmr is the relative change in MR which occurs when the applied magnetic field is changed over ±100 Oe).

Figure 15:
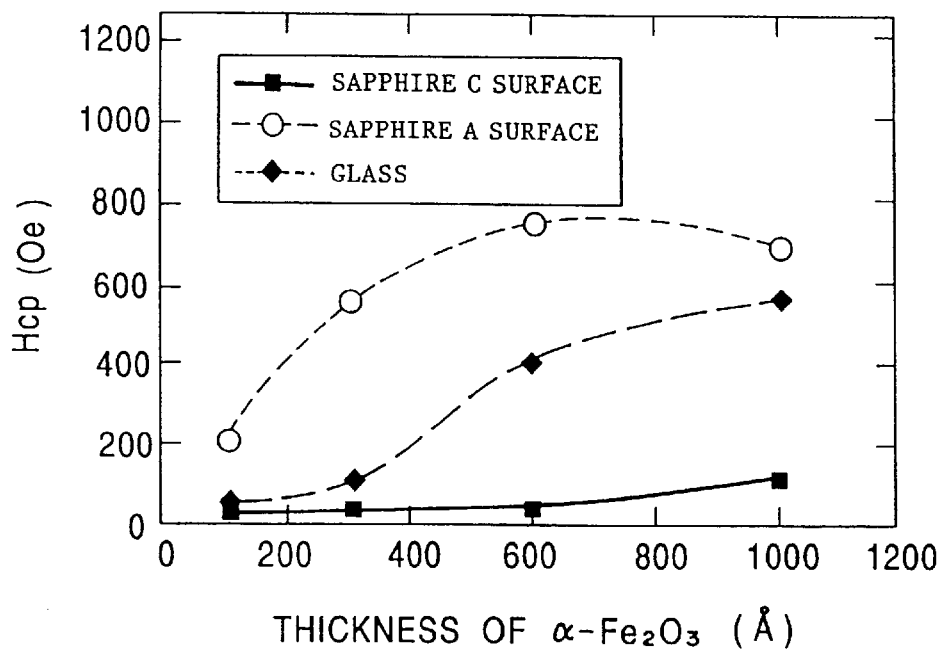
FIG. 15 is a graph illustrating the dependence of the thickness of the $\alpha$-$Fe_2O_3$ layer on the $H_{cp}$ for samples having an $\alpha$-$Fe_2O_3$ layer epitaxially grown on the C surface of a sapphire substrate, the A surface of a sapphire substrate, and a glass substrate, respectively.
Figure 16:
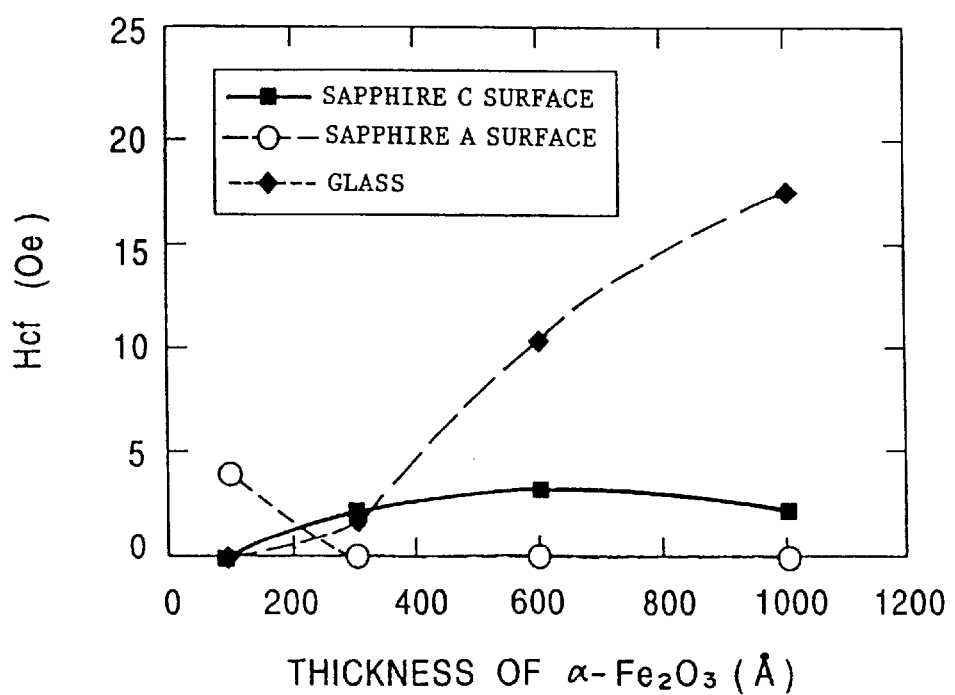
FIG. 16 is a graph illustrating the dependence of the thickness of the $\alpha$-$Fe_2O_3$ layer on the $H_{cf}$ for samples having an $\alpha$-$Fe_2O_3$ layer epitaxially grown on the C surface of a sapphire substrate, the A surface of a sapphire substrate, and a glass substrate, respectively.
Figure 17:
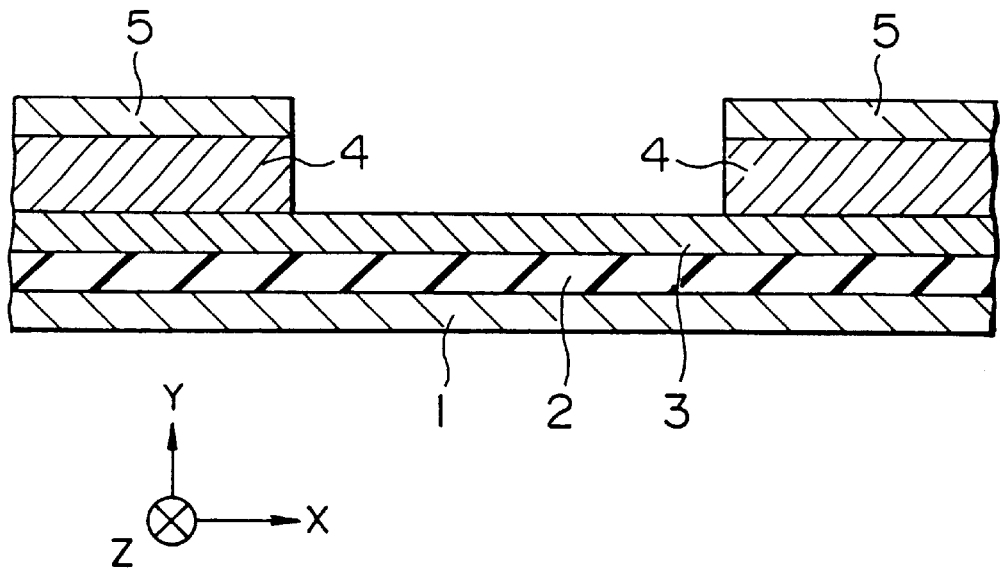
FIG. 17 is a cross-sectional view illustrating a first example of a conventional AMR head.
Figure 18:
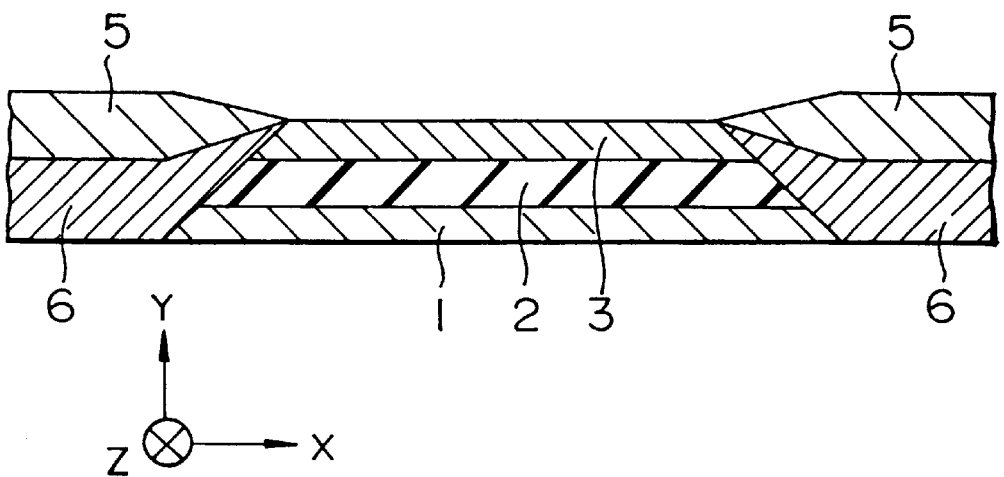
FIG. 18 is a cross-sectional view illustrating a second example of a conventional AMR head.
Figure 19:
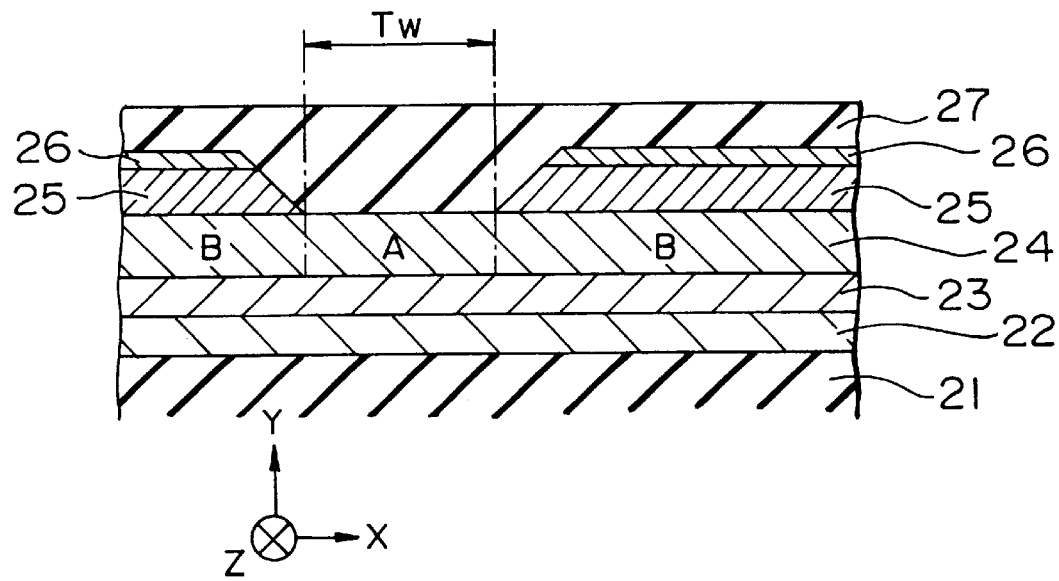
FIG. 19 is a cross-sectional view illustrating an example of a conventional GMR head of the exchange bias type.
Figure 20:
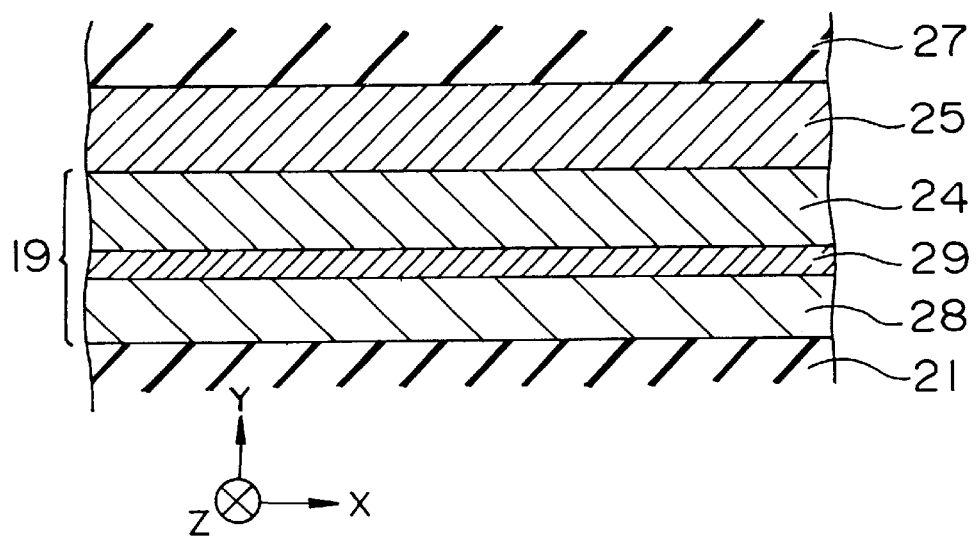
FIG. 20 is a cross-sectional view illustrating an example of a conventional GMR head of the spin valve type.

Furthermore, the dependence of the thickness of the α-Fe$_2$O$_3$ layer on the coercive force H$_{cp}$ of the pinned ferromagnetic layer is shown in FIG. 15, and the dependence of the thickness of the α-Fe$_2$O$_3$ layer on the coercive force H$_{cp}$ of the free ferromagnetic layer is shown in FIG. 16.

As can be seen from FIG. 13, a sample having a (11$\bar{2}$0) α-Fe$_2$O$_3$ layer formed on the A surface of a sapphire substrate has a great change in magnetoresistance ΔMR such as 4% or greater over a wide thickness in the range from 100 Å (10 nm) to 1000 Å.

Figure 14:
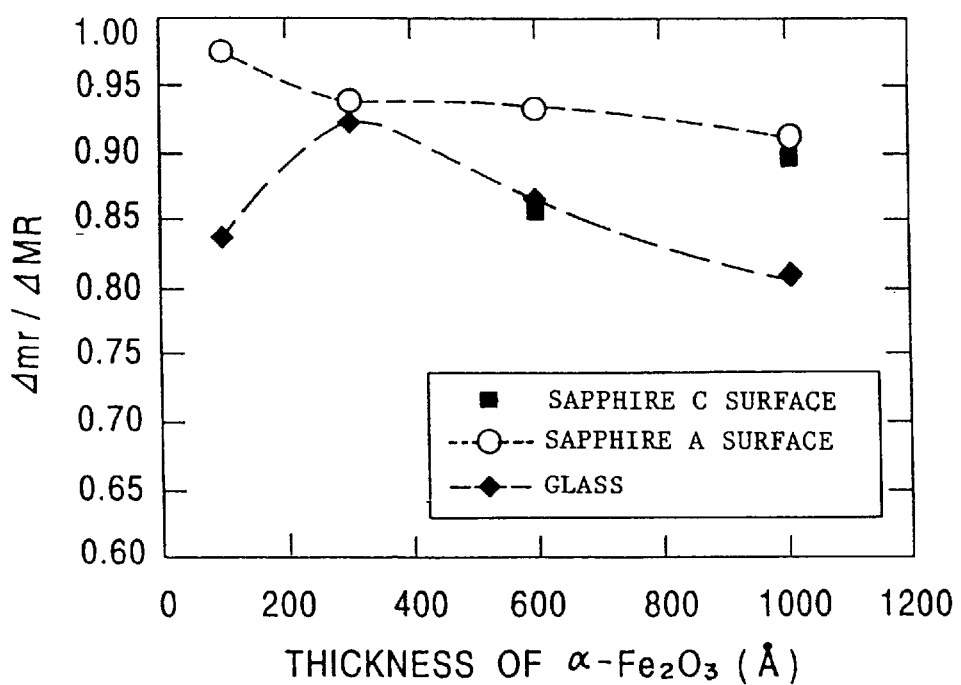
FIG. 14 is a graph illustrating the dependence of the thickness of the $\alpha$-$Fe_2O_3$ layer on the $\Delta$mr/$\Delta$MR ratio for samples having an $\alpha$-$Fe_2O_3$ layer epitaxially grown on the C surface of a sapphire substrate, the A surface of a sapphire substrate, and a glass substrate, respectively.

From FIG. 14, it can be seen that a sample having a (11$\bar{2}$0) α-Fe$_2$O$_3$ layer formed on the A surface of a sapphire substrate has a greater squareness ratio and a higher low-magnetic field sensitivity than can be achieved by a sample having an amorphous α-Fe$_2$O$_3$ layer formed on a glass substrate.

From comparison between FIGS. 15 and 16 it can be seen that it is possible to achieve a great enough difference in coercive force between the pinned ferromagnetic layer and the free ferromagnetic layer over a wide thickness range from 100 to 1000 Å. H$_{cp}$ is a measure of stability against a disturbance of magnetic field. The sample having the (11$\bar{2}$0) α-Fe$_2$O$_3$ layer formed on the A surface of the sapphire substrate has a high enough value of H$_{cp}$ over a wide thickness range above 100 Å.

What is claimed is:

1. A magnetoresistance device comprising two ferromagnetic layers separated by a non-magnetic layer, the coercive force of one of said two ferromagnetic layers being enhanced by a coercive force enhancement layer of an antiferromagnetic material disposed adjacent to said one of the two ferromagnetic layers thereby pinning magnetization inversion in said one of the two ferromagnetic layers, the other ferromagnetic layer of the two ferromagnetic layers serving as a free ferromagnetic layer in which magnetization inversion is allowed, wherein said coercive force enhancement layer is made up mainly of α-Fe$_2$O$_3$ in the form of a polycrystal, said α-Fe$_2$O$_3$ crystal being uniaxially oriented so that the {0001} surface of said α-Fe$_2$O$_3$ becomes perpendicular to the thickness direction of said coercive force enhancement layer.

2. A magnetoresistance device according to claim 1, wherein said free ferromagnetic layer is magnetized into a single domain in a direction perpendicular to the magnetization direction of said pinned ferromagnetic layer and parallel to the plane of said free ferromagnetic layer.

3. A magnetoresistance device according to claim 1, wherein Fe of said α-Fe$_2$O$_3$ is partly replaced by one or more elements selected from the group consisting of Ti, V, Cr, Mn, Co, Ni, Cu, and Zn.

4. A magnetoresistance device comprising two ferromagnetic layers separated by a non-magnetic layer, the coercive force of one of said two ferromagnetic layers being enhanced by a coercive force enhancement layer of an antiferromagnetic material disposed adjacent to said one of the two ferromagnetic layers thereby pinning magnetization inversion in said one of the two ferromagnetic layers, the other ferromagnetic layer of the two ferromagnetic layers serving as a free ferromagnetic layer in which magnetization inversion is allowed, wherein said coercive force enhancement layer is made up mainly of α-Fe$_2$O$_3$ in the form of a polycrystal, said α-Fe$_2$O$_3$ crystal being uniaxially oriented so that the {11$\bar{2}$0} surface of said α-Fe$_2$O$_3$ becomes parallel to said coercive force enhancement layer.

5. A magnetoresistance device according to claim 4, wherein said free ferromagnetic layer is magnetized into a single domain in a direction perpendicular to the magnetization direction of said pinned ferromagnetic layer and parallel to the plane of said free ferromagnetic layer.

6. A magnetoresistance device according to claim 4, wherein Fe of said α-Fe$_2$O$_3$ is partly replaced by one or more elements selected from the group consisting of Ti, V, Cr, Mn, Co, Ni, Cu, and Zn.

* * * * *